(12) United States Patent
Poulter et al.

(10) Patent No.: US 6,428,126 B1
(45) Date of Patent: Aug. 6, 2002

(54) SUPPORT FOR ELECTRONIC DEVICES

(75) Inventors: Darrel Poulter, Middleton; Thomas W Ives, Boise; Jon Anson, Meridian, all of ID (US)

(73) Assignee: Hewlett-Packard Co., Palo Alto, CA (US)

( * ) Notice: Subject to any disclaimer, the term of this patent is extended or adjusted under 35 U.S.C. 154(b) by 41 days.

(21) Appl. No.: 09/687,364

(22) Filed: Oct. 13, 2000

(51) Int. Cl.[7] ............................................... A47B 47/00
(52) U.S. Cl. ..................... 312/263; 312/111; 312/351
(58) Field of Search ............................. 312/107, 108, 312/111, 198, 265.5, 265.6, 350, 351, 330.1, 223.1, 332.1, 223.2, 263, 257.1; 403/381; 454/184

(56) References Cited

U.S. PATENT DOCUMENTS

| | | | | |
|---|---|---|---|---|
| 3,575,465 A | * | 4/1971 | Dolby | ......................... 312/107 |
| 3,851,936 A | * | 12/1974 | Muller | ......................... 312/108 |
| 4,408,812 A | * | 10/1983 | Krautwurst | ............. 312/111 X |
| 4,523,254 A | * | 6/1985 | Konshak | |
| 5,642,923 A | * | 7/1997 | Meacham et al. | ...... 312/263 X |
| 5,690,401 A | * | 11/1997 | Franklin | ..................... 312/107 |
| 5,808,867 A | * | 9/1998 | Wang | |
| 6,108,198 A | * | 8/2000 | Lin | |

* cited by examiner

Primary Examiner—Janet M. Wilkens

(57) ABSTRACT

Methods and apparatus for supporting a plurality of electronic, or electrical, devices include at least one elongated structural element that defines an elongated channel in which the devices can be supported. The structural element can be a singlepiece configuration. A plurality of support surfaces can be defined on the structural element, or can be defined on a support member which is mounted on the structural element. The support surfaces supportably contact each of the devices while the devices are supported on the structural element. Two or more structural elements can be connected to one another in a substantially parallel orientation to provide additional supporting capacity for additional devices. A fan can be employed to induce the flow of a stream of air through a respective structural element to facilitate cooling of the devices.

9 Claims, 14 Drawing Sheets

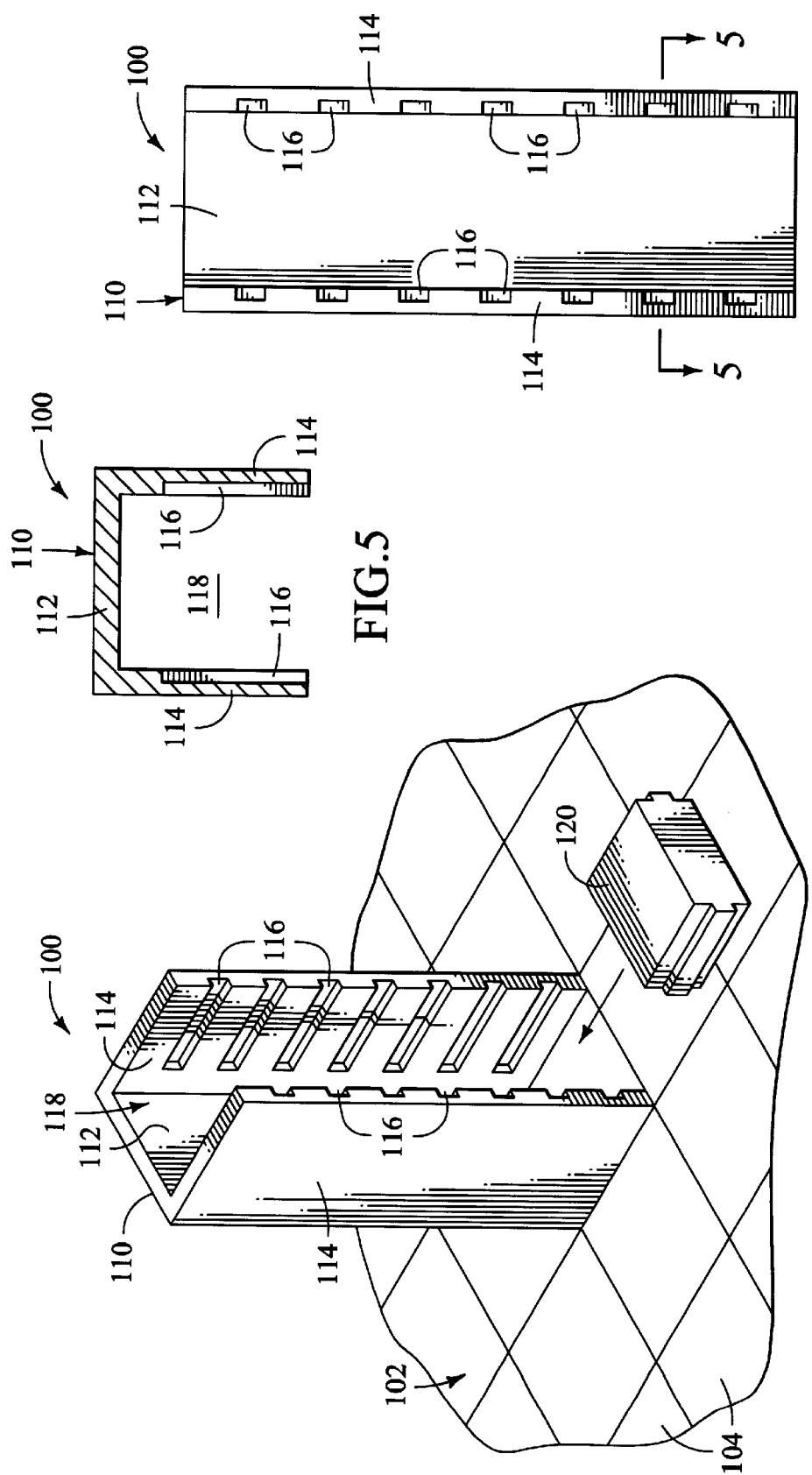

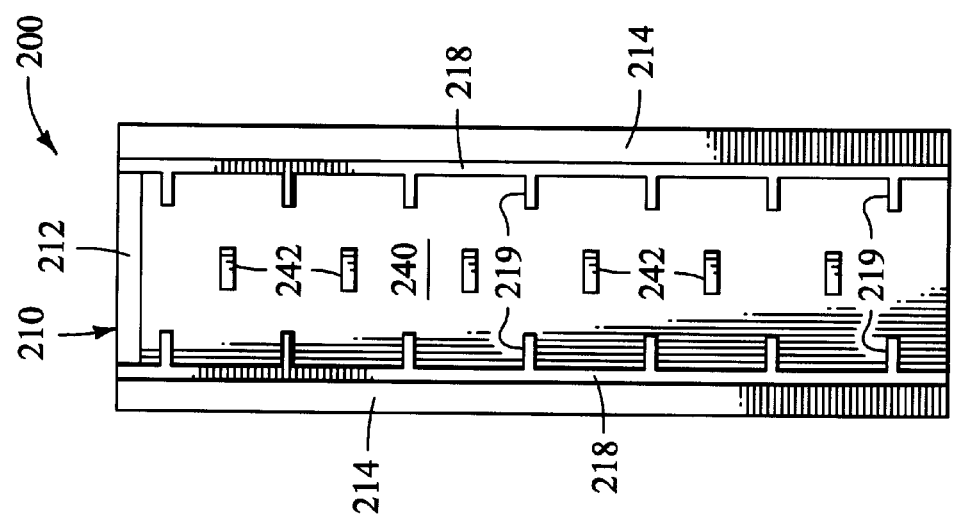
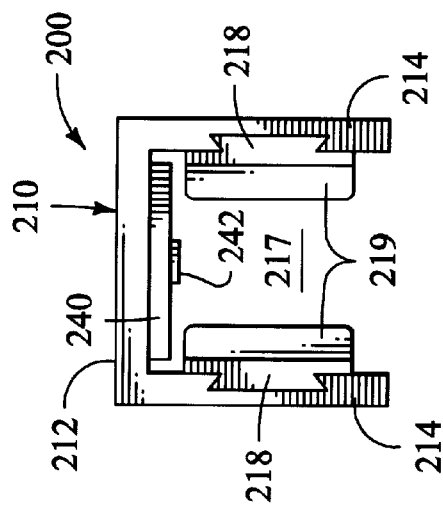
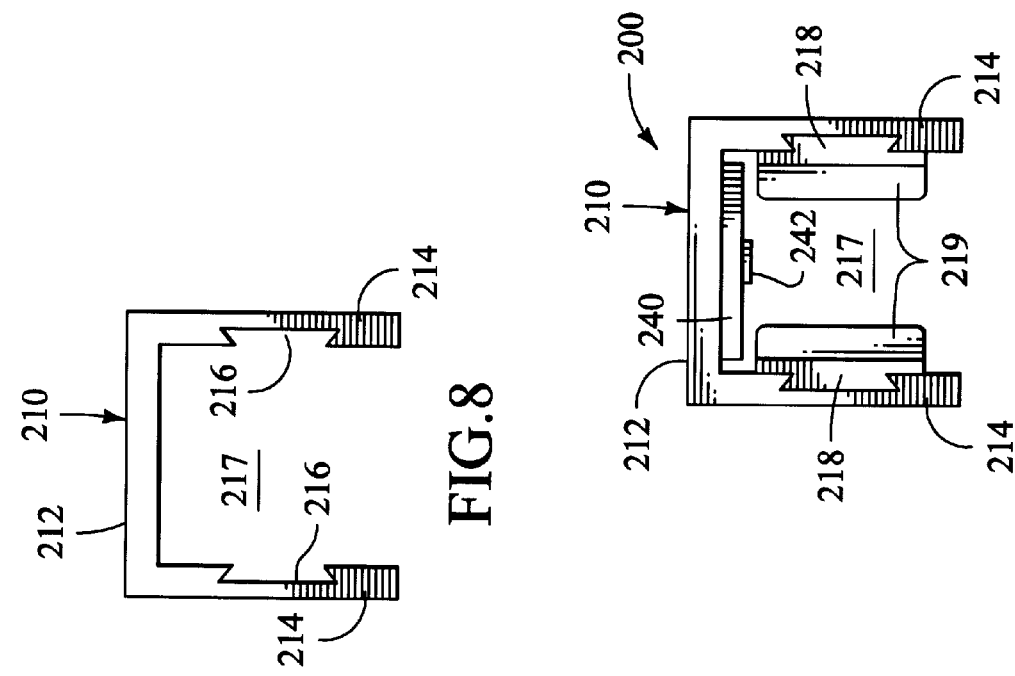
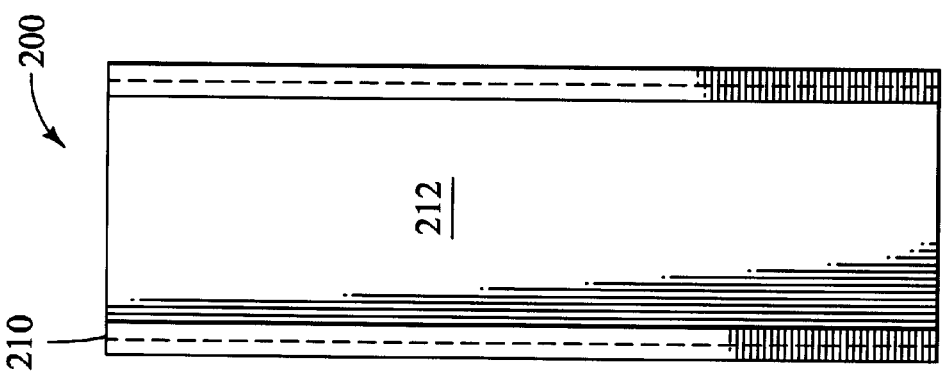

SUPPORT FOR ELECTRONIC DEVICES

FIELD OF THE INVENTION

This invention pertains to methods and apparatus for supports for electronic devices.

BACKGROUND OF THE INVENTION

Most prior art electronic equipment, such as large computers, is made up of sub-components which, in turn, comprise various electronic and electrical devices. These sub-component electronic and electrical devices are generally supported on a structural support, such as a chassis, frame, or the like, which can support a plurality of such devices. The electronic and electrical devices which make up the electronic equipment can be any of a number of different types of devices. The sub-component devices can include disk drives, controllers, and power supplies, to name only a few examples. Often, the electronic and electrical devices are configured to be modular.

Referring to FIG. 1, a semi-exploded view is shown of a typical unit of prior art electronic equipment which includes a structural support for supporting modular electronic and electrical devices. As is seen, the prior art unit of electrical equipment 10 typically includes a structural support 11 comprising a base 20 which rests on a floor 12, or the like. Uprights 22 are welded or fastened to the base 20 as shown. A top frame 24 is welded or fastened to the upper ends of the uprights 22 in a like manner. The support 11 can also include side panels 26 and a top panel 27 which can be fastened to the uprights 22 and top frame 24 respectively. Additionally, several pairs of rails 32 can be fastened to the uprights 22 as shown, using threaded fasteners (not shown) or the like. Each pair of rails 32 can support a chassis 34 which is often fastened to the rails. Several modular electronic or electrical devices 36 are removably housed within each chassis 34.

The modular configuration of the devices 36 provides many advantages. One such advantage of the modular configuration is that devices 36 can be added to the unit of electronic equipment 10 on an "as-required" basis. For example, as additional electronic equipment capacity is required, additional sub-component devices 36, can be installed into the unit 10 and electrically connected to the system. This practice of adding individual sub-component devices 36 to a system is advantageous because it provides for efficient utilization of the sub-component devices. That is, the sub-component devices 36 are added to the unit of electronic equipment 10 incrementally as they are required, which minimizes idle sub-component devices.

However, several problems are associated with the use of the prior art supports 11 which are configured in the manner described above. Most of these problems associated with the prior art supports 11 stem from the configuration of the supports 11 which tend to be relatively large and heavy, and also tend to have a high parts-count. One of the problems that result from the configuration of the prior art support structures is an inefficiency in the use of valuable floor space. Specifically, a typical prior art support 11 generally takes up a considerable amount of floor space even if only a few sub-component devices 36 are supported on it. That is, a typical prior art support 11 will occupy a large footprint even though a very small portion of the structure is utilized for supporting sub-component devices 36. Also, the large footprint of typical prior art supports prevents their use in situations where only a small amount of floor space is available. In such cases, the available floor space will go unused which results in wasted floor space. This inefficiency in the use of floor space can be undesirable because such floor space is often located in data rooms in which the environmental conditions are tightly controlled. The floor space in such rooms is often in high demand and in short supply.

Another problem associated with the configuration of prior art supports 11 is that the relatively heavy, bulky nature of the supports inhibits the mobility of the supports. This can be undesirable since it is sometimes necessary to relocate a support 11 within a data room, or the like. The heavy, bulky nature of the prior art supports 11 can thus result in difficult relocation procedures. An additional problem with the configuration of the prior art supports 11 is that the supports are constructed from many different parts including multitudes of fasteners (not shown) which hold the parts together. This relatively high parts-count of the structures necessitates large inventories of spare parts and also creates complex repair procedures in the event that a support structure is damaged. Additionally, prior art supports 11 are sometimes too heavy for the raised flooring, which can cause failure of the raised flooring.

Moving now to FIG. 2, a side elevation view is shown of the prior art unit of electronic equipment 10 which is depicted in FIG. 1. As is seen, each chassis 34 generally houses at least one fan module 38 which causes a stream of cooling air 40 to flow through the respective chassis 34 to cool the respective sub-component devices 36. The fan modules 38 are usually located behind the sub-component devices 36 as shown. The stream of cooling air 40 generally flows through each respective chassis 34 in a lateral direction as shown. This configuration results in at least one fan module 38 for each chassis 34. This can result in a unit of electronic equipment 10 which houses a relatively high number of fans. This, in turn, can cause excessive noise and can create complex maintenance problems. Also as is seen, objects (not shown) cannot be placed adjacent to the support 11 which would block the flow of the streams of cooling air 40 through the chassis 34. Further, the lateral movement of cooling air is contrary to the natural convection flow direction of cooling air, which is generally in the upward direction. This contrary movement of the cooling air in prior art electronic equipment 10 results in an inefficient design.

Therefore, it is desirable to provide a support apparatus which achieves the benefits to be derived from similar prior art devices, but which avoids the shortcomings and detriments individually associated therewith.

SUMMARY OF THE INVENTION

This invention pertains to methods and apparatus for supporting a plurality of electronic devices. In accordance with one embodiment of the present invention, a support apparatus includes a structural element that defines a channel in which at least one electronic device can be supported. The apparatus includes a plurality of support surfaces that are defined on the structural element and which can supportably contact the electronic devices to support them. The support apparatus can comprise a single-piece structural element or a multi-piece structural element. The structural element can comprise an extrusion comprising a number of materials, including aluminum. The structural element can also be formed using any of a number of other methods.

In accordance with another embodiment of the present invention, a support apparatus includes at least one structural element that defines a channel in which at least one groove can be defined. The groove can be substantially longitudinal and can be undercut. The apparatus also includes a support member having a plurality of support surfaces defined on it. The support member can be configured to engage the groove within the channel so as to be mounted on the structural element within the channel. The support member can support a plurality of electronic devices on the support surfaces which supportably contact the devices.

In accordance with yet another embodiment of the present invention, a support apparatus includes at least two structural elements that can be connected to one another so as to each support at least one electronic device. The structural elements can be connected to one another in a substantially parallel orientation that can include a side-by-side orientation, a back-to-back orientation, and an end-to-end orientation. The structural elements can be connected to one another using any of a number of methods that can include forming an outer groove on each of the structural elements. An interlock member can be engaged simultaneously with the outer grooves of at least two adjacent structural elements that are to be connected together. Additional structural elements can be connected together in this manner to provide additional support capacity for electronic devices as they are added to the apparatus.

In accordance with a further embodiment of the invention, a support apparatus includes at least one structural element with a solid panel or door that substantially creates a tunnel-like enclosure in which the electronic devices can be supported. The apparatus also includes a cap assembly that houses a fan or blower. The cap assembly can be attached to one end of the structural support which is opposite the floor. The fan can induce a stream of air to flow through an opening in the floor beneath the apparatus, or near the apparatus, for cooling the electronic devices. The stream of air can also be directed through a ceiling after exiting the structural element through the cap assembly. Additionally, a base assembly can be attached to an end of the structural element opposite the cap assembly. The base assembly can also house a fan or blower to provide additional air handling capability.

In accordance with yet a further embodiment of the present invention, a support apparatus includes at least one structural element that has a perforated, or substantially open, door or panel. The apparatus further includes a cap assembly that houses a fan or blower. The fan can induce a stream of air to flow through the door or panel and between or through the electronic devices for cooling the devices. The stream of air can be directed out of the apparatus through the cap assembly.

In accordance with still a further embodiment of the present invention, a method of supporting at least one electronic device includes forming or providing a structural member that defines a channel in which the electrical devices can be supported. The method also can include mounting a support member on the structural element for supporting the electronic devices and supporting the devices on the support member.

BRIEF DESCRIPTION OF THE DRAWINGS

FIG. 3 is a perspective view of a support apparatus in accordance with the first embodiment of the present invention.

FIG. 4 is a front elevation view of the structural element of the apparatus depicted in FIG. 3

FIG. 5 is a top view of the structural element depicted in FIG. 4.

FIG. 7 is a front elevation view of the structural element of the apparatus depicted in FIG. 6

FIG. 8 is a top view of the structural element depicted in FIG. 7.

FIG. 9 is a front elevation view of the apparatus depicted in FIG. 6.

FIG. 10 is a top view of the apparatus depicted in FIG. 9.

DETAILED DESCRIPTION OF THE INVENTION

Figure 1:
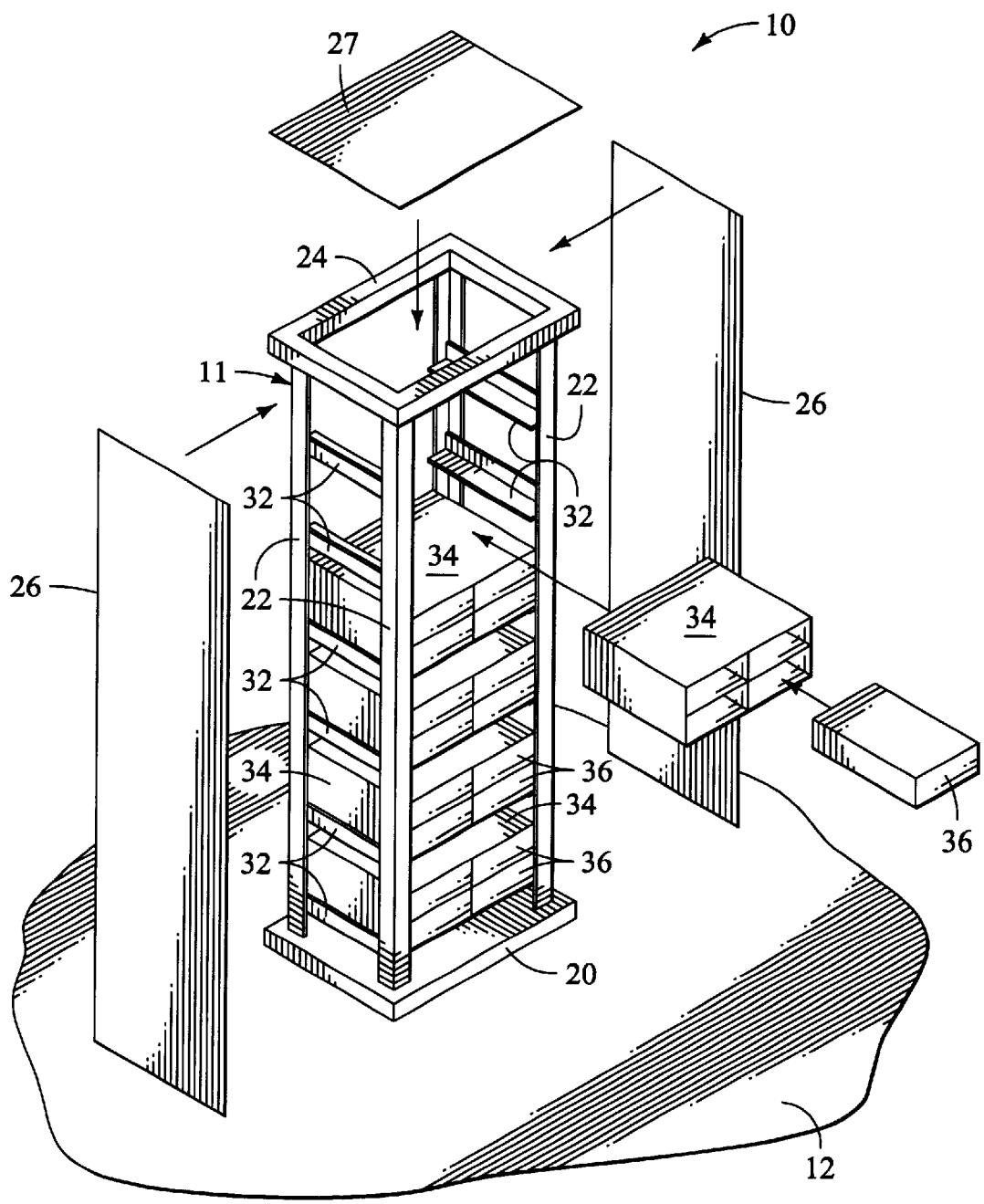
FIG. 1 is a semi-exploded perspective view of a prior art support apparatus.
Figure 2:
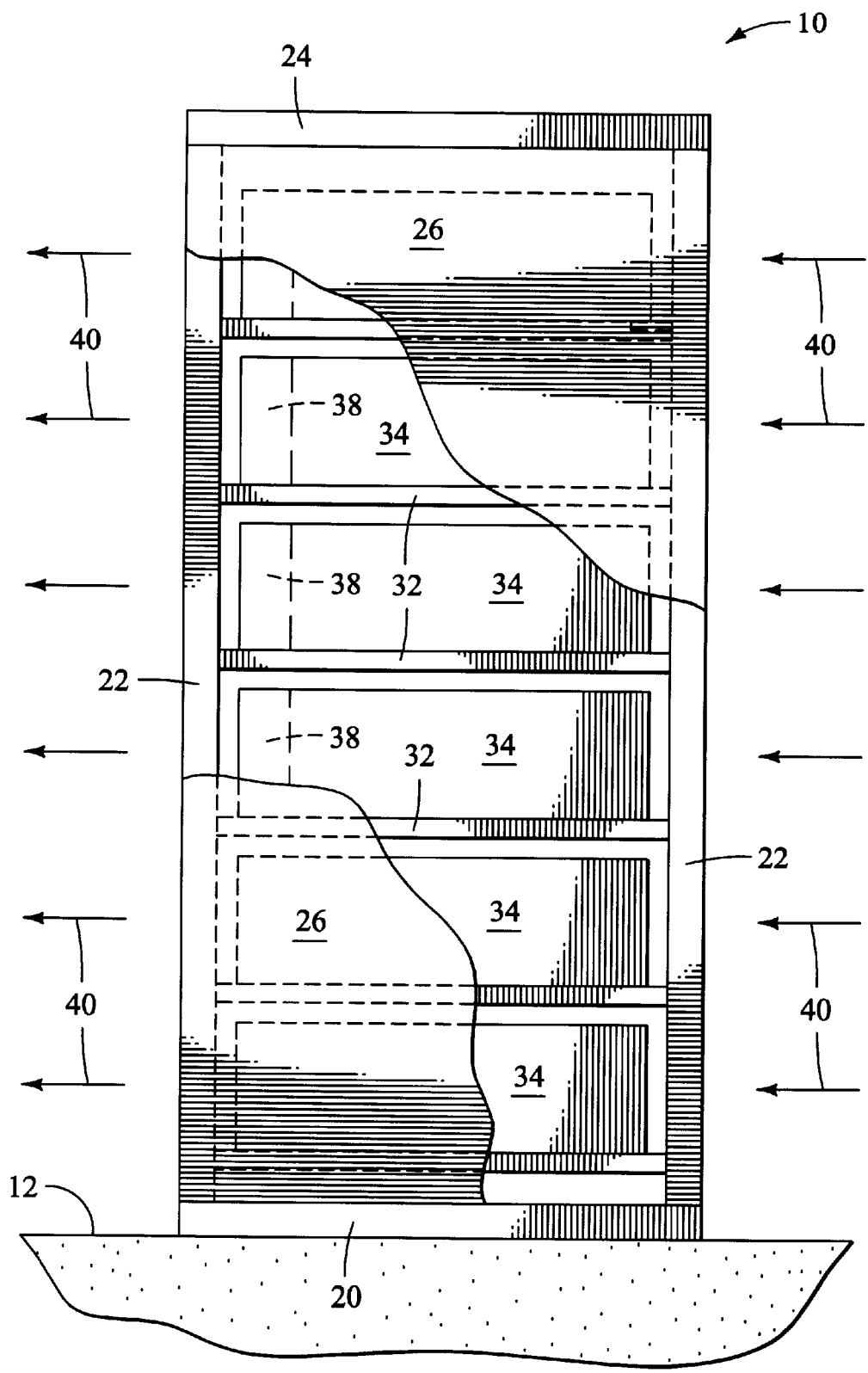
FIG. 2 is a side elevation view of the fully assembled prior art support apparatus shown in FIG. 1.

The invention includes methods and apparatus for providing a support for supporting a plurality of electronic, or electrical, devices. In accordance with one embodiment of the invention, a support apparatus comprises a structural element that defines an elongated channel in which at least one electronic, or electrical, device can be supported. A plurality of support surfaces are defined on the structural element. The support surfaces are configured to supportably contact the electronic devices while the devices are supported within the channel. In accordance with an alternative embodiment of the present invention, the support surfaces can be defined on a support member which can be mounted on the structural element.

In accordance with another embodiment of the invention, a support apparatus includes at least two structural elements which can be connected to one another in a substantially parallel orientation. Each of the structural elements define a channel and can each support at least one electronic device within each respective channel. The structural elements can be connected to one another in several substantially parallel orientations, including side-by-side, back-to-back, and end-to-end. In accordance with yet another embodiment of the present invention, a support apparatus includes a fan or blower that can be employed to induce a stream of air to flow through the channel defined by the structural element in order to facilitate cooling of the electronic devices.

In accordance with a still further embodiment of the present invention, a method for supporting a plurality of electronic devices includes forming, or providing, a structural element that defines a channel, and supporting at least one electronic device within the channel.

Referring now to FIG. 3, a perspective view is shown of a support apparatus 100 in accordance with a first embodiment of the present invention. The support apparatus 100 comprises an elongated structural element 110. The structural element 110 can be substantially straight and can be configured to stand substantially upright on a floor 102, or other suitable surface. The structural element 110 can have a substantially flat, elongated web portion 112. The web portion 112 is oriented between a pair of spaced, substantially flat, elongated, juxtaposed flange portions 114 which extend from the web portion. As is seen, the flange portions 114 can extend substantially normally from the web portion 112, in which case the flange portions are substantially parallel to one another. It is evident that the structural element 110 can be of a single piece of material. Alternatively, a multi-piece structural element (not shown) can be utilized.

The structural element 110 also has a plurality of substantially parallel support surfaces 116. The support surfaces can be defined on each of the flange portions 114 as shown. As is also seen, the web portion 112 together with the flange portions 114 define a longitudinal three-sided channel 118. The structural element 110 is configured to removably support a plurality of electronic devices 120 within the channel 118. Each electronic device 120 can be configured to engage a pair of support surfaces 116 as the electronic device is supported on the structural element 110. Each electronic device 120 can be any of a number of electronic or electrical devices employed as sub-components of electronic and electrical equipment (not shown) including, disk drives, controllers, power supplies, and the like.

Moving now to FIGS. 4 and 5, a front elevation view is shown in FIG. 4 of the structural element 110 which is depicted in FIG. 3. FIG. 5 shows a view of the cross-sectional profile of the structural element 110 which is depicted in FIG. 4. As is seen, the structural element 110 can have a substantially rectangular cross-sectional profile. Additionally, the cross-sectional profile of the structural element 110 can be substantially dimensionally constant along its length. Referring now to FIGS. 3 and 5, it is seen that the floor 102 can comprise a plurality of floor tiles 104. It is also seen that the foot print, or cross-sectional profile, of the structural element 110 can be substantially dimensionally similar to that of a floor tile 104 of a floor 102 on which the structural element is supported. That is, the foot print of the structural element 110 can be made to substantially dimensionally match the size of the floor tiles 104.

By "dimensionally match" we mean that the structural element is made to have a foot print which has dimensions which each can be any whole ratio of the dimensions of the floor tile. For example, the structural element 110 can be made to have foot print dimensions which are substantially equal to the dimensions of the floor tile 104. In that case, one structural element 110 would cover substantially the same foot print as one floor tile 104. As a further example, the structural element 110 can be made to have foot print dimensions which are substantially one-half of the dimensions of the floor tile 104. In that case, four structural elements 110 arranged in a two-by-two pattern would cover substantially the same foot print as one floor tile 104. In yet a further example, the structural element 110 can be made to have foot print dimensions which are substantially twice the dimensions of the floor tile 104. In that case, one structural element 110 would cover substantially four floor tiles 104 in a two-by-two pattern. Also, one dimension of the structural element 110 can equal one dimension of the floor tile 104, while the other dimension of the structural element can be less than, or greater than, the other dimension of the floor tile. The relevance of this shall become apparent in later discussion.

The structural element 110 can be formed using a number of possible forming techniques and materials. For example, the structural element 110 can be formed by an extrusion process, in which case the support surfaces 116 can be formed by cutting or machining. Extrusions can be formed from various materials such as aluminum, plastic, or vinyl. Additionally, the structural element 110 can be formed by molding, including injection molding. For example, the structural element can be formed from a material comprising plastic by injection molding. Alternatively, the structural element 110 can be molded from a fiberglass-resin composite material. In the case of a molded structural element 110, the support surfaces 116 can be formed as part of the molding process. In accordance with an alternative embodiment (not shown) of the invention, the structural element 110 can be formed from plate or sheet material, in which case the support surfaces 116 can be pressed into the structural element. Although the support surfaces 116 are depicted as being recessed into the flange portions 114, it is understood that the support surfaces can be configured to protrude from the flange portions. Moreover, it is understood that, although not shown, the support surfaces 116 can also, or in the alternative, be formed on the web portion 112 of the structural element 110.

Figure 6:
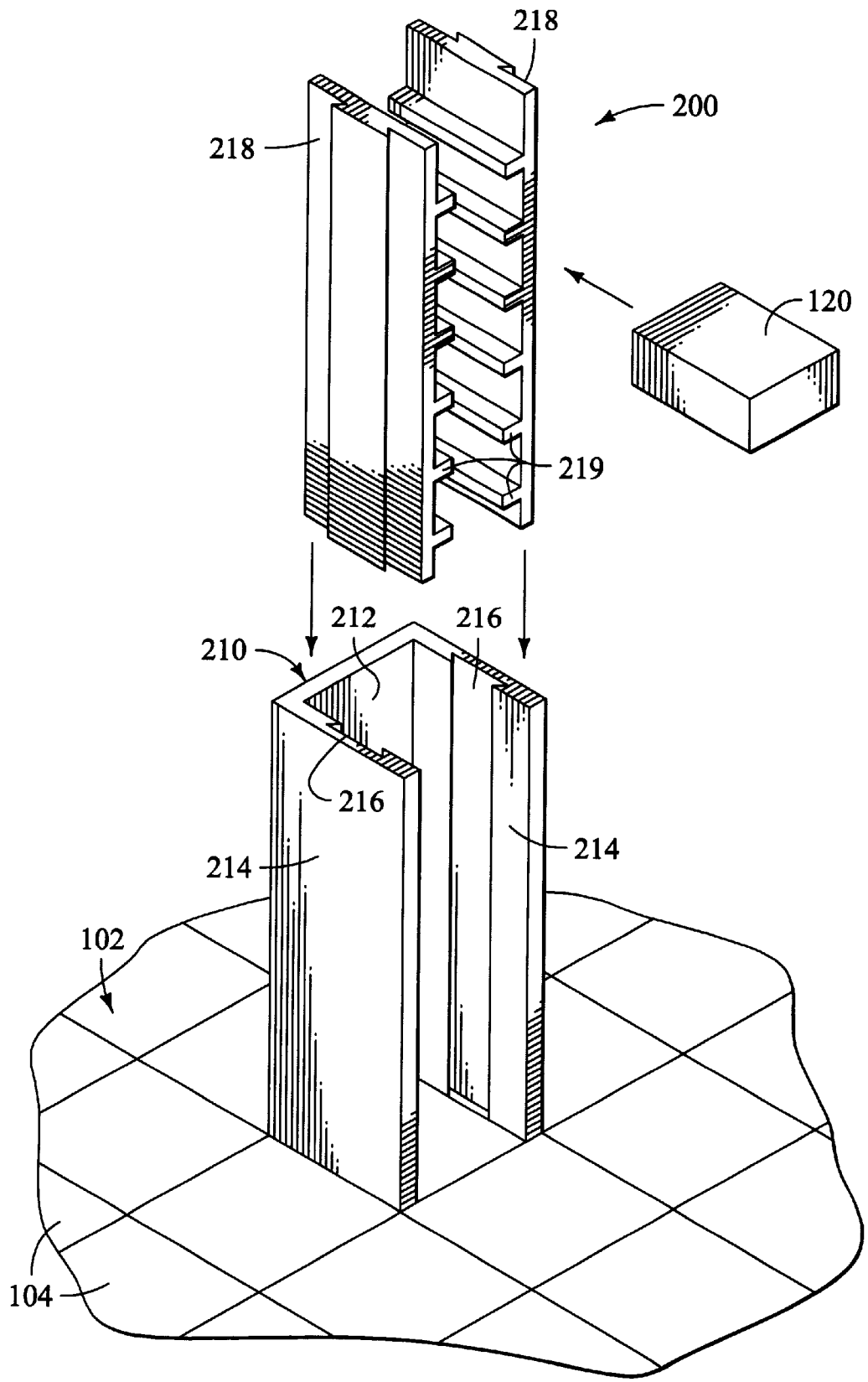
FIG. 6 is an exploded perspective view of a support apparatus in accordance with the second embodiment of the present invention.

Turning now to FIG. 6, an exploded perspective view is shown of a support apparatus 200 in accordance with a second embodiment of the present invention. The apparatus 200 comprises an elongated structural element 210 which can be configured to stand substantially upright while resting on a floor 102, or the like. The floor 102 can comprise a plurality of floor tiles 104. It is seen that the cross-sectional profile of the structural element 210 can be substantially dimensionally similar to one of the floor tiles 104. Although the structural element 210 is depicted as standing upright, it is understood that the structural element can be supported in any of a number of other possible orientations, such as horizontally. Also, it is understood that the structural element 210 need not rest on a floor 102, but can be supported by any of a number of possible objects or surfaces. The structural element 210 can have a web portion 212 and a pair of flange portions 214 which are oriented in a manner described above for FIGS. 3 through 5. The structural element 210 can also define at least one groove 216. As is seen, the grooves 216 can be substantially longitudinal with respect to the structural element 210 and can be open-ended. The apparatus 200 can also comprise at least one support member 218 which is configured to be mounted on the structural element. Each support member 218 can define a plurality of support surfaces 219. Each support surface 219 is configured to at least partially support an electronic device 120 in a removable manner.

Moving to FIGS. 7 and 8, a front elevation view is shown in FIG. 7 of the structural element 210 which is depicted in FIG. 6. A top view is shown in FIG. 8 of the structural element 210 which is depicted in FIG. 7. As is seen, the web portion 212, together with the pair of flanged portions 214, define a channel 217. As is further seen, the grooves 216 are located within the channel 217. The grooves 216 can be undercut as shown. Although the grooves 216 are depicted as having a "dove-tail" cross-sectional profile, it is understood that the grooves 216 can alternatively have other cross-sectional profiles which achieve a similar function.

It is evident that the structural element 210 can be produced by any number of possible methods, including extruding, molding, and bending. It is also evident that the structural element 210 can be produced from a number of possible materials including materials comprising steel, aluminum, plastic, vinyl, and resin. The grooves 216 can be formed in the structural element 210 by any of a number of possible forming methods. For example, in the case of an extruded structural element 210, the grooves 216 can be formed as part of the extrusion process. The grooves 216 can also be cut, or machined, into the structural element 210.

Figure 10B:
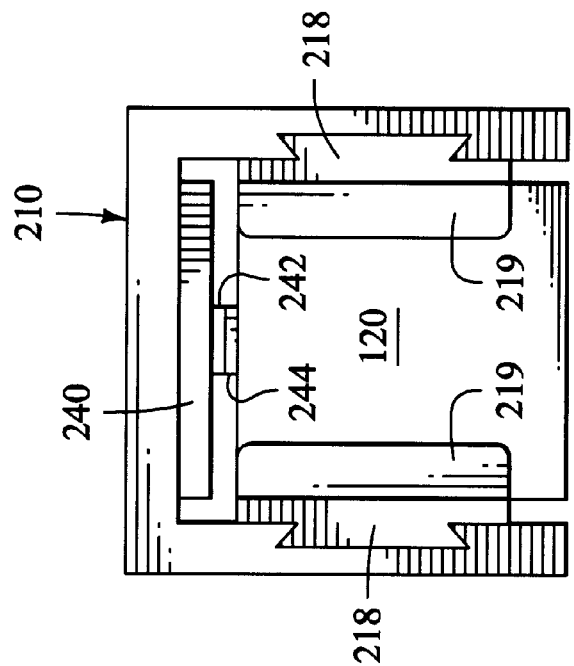
FIG. 10B is a view of the apparatus depicted in FIG. 10A showing the electrical device placed on to the apparatus.
Figure 10A:
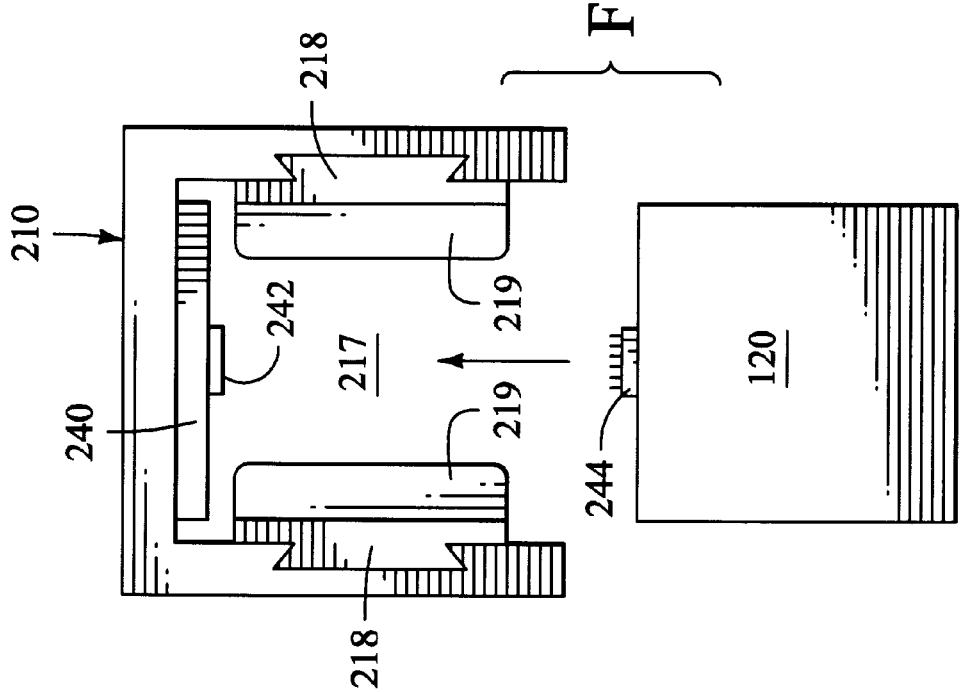
FIG. 10A is a view of the apparatus depicted in FIG. 10, showing an electrical device about to be placed onto the apparatus.

Turning now to FIGS. 9 and 10, a front elevation view is shown in FIG. 9 of the structural element 210 with the support members 218 which are depicted in FIG. 6. It should be noted that in FIG. 9 the support members 218 are shown mounted on the structural element 210. Also, a top view is shown in FIG. 10 of the structural element 210 and support members 218 which are depicted in FIG. 9. Each of the support surfaces 219 can be in the form of a shelf, or the like, which protrudes into the channel 217. Alternatively, the support surfaces 219 can be configured to be recessed rather than protruding as shown. The support surfaces 219 are configured to supportably engage at least one electronic device 120 shown in FIG. 6. Also, as shown in FIGS. 9 and 10, the support surfaces 219 can be substantially normal to the structural element 210. As is seen, each of the support members 218 is supportably engaged with one of the grooves 216. By "supportably engaged" we mean that the support member 218 is engaged with the groove 216 and supported by the groove so as to be mounted on the support element 210.

As is seen, the support member 218 can also be slidably inserted into the groove 216 so as to be supportably engaged thereto. The support member 218 can also be configured so as to have a slight press-fit, or interference-fit, with the groove 216. As in the case of the structural element 210, the support members 218 can be produced by any of a number of possible methods. For example, the support members 218 can be produced by injection molding. Furthermore, the support member 218 can be produced from a number of materials.

As is also evident, the support apparatus 200 can be configured to support a back plane 240, or other such device, within the channel 217. The back plane 240 can have any of a number of configurations such as a printed circuit board, or the like. A plurality of first connector portions 242 can be supported on the back plane 240. As shown, each of the first connector portions 242 can be positioned on the back plane 240 so as to correspond with at least one support surface 219. From FIGS. 10A and 10B, it can be seen that each electrical device 120 can be provided with a second connector portion 244. The second connector portion 244 can be configured to electrically couple with the first connector portion 242 when the electrical device 120 is supported on the structural element 210. The use of electrical connector portions 242, 244 can facilitate an electrical connection between the back plane 240 and any of the electrical devices 120.

Figure 11A:
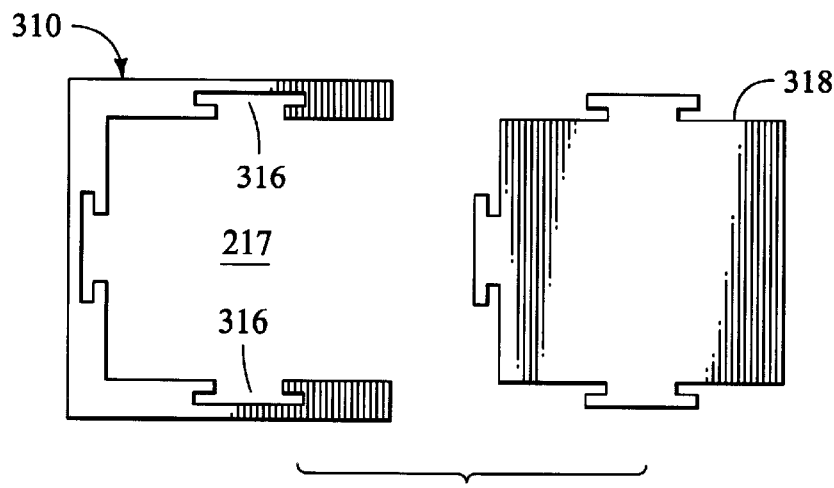
FIG. 11A is a top view of a structural element in accordance with a third embodiment of the present invention.

Moving now to FIG. 11A, a top view is shown of an alternatively configured structural element 310 in accordance with the second embodiment of the present invention described above for FIGS. 6 through 10B. Longitudinal grooves 316 are defined on the structural element 310 and within the channel 217 in a manner similar to that described for FIGS. 6 through 10B above. It is seen from FIG. 11A that the longitudinal grooves 316 can have a "T-shaped" cross-sectional profile, although profiles having other shapes employed. The support member 318 is configured to engage the grooves 316 so as to be mounted on the structural element 310. While the support member 318 is mounted on the structural element 310, the support member can supportably engage at least one electronic device as shown in FIG. 6. Further shown in FIG. 11A, it is seen that any number of longitudinal grooves 316 can be defined in the structural element 310. As is seen, three grooves 316 are defined in the structural element 310 rather than two grooves 216 as described for FIGS. 6 through 10 above. Moreover, a single support member 318 is used rather that two individual support members 216 as described for FIGS. 6 through 10B above. It is also seen from FIG. 11A that the grooves 316 are substantially flush with the structural element 310. That is, the grooves 316 are substantially below the surface of the structural element 310. However, it is understood that the grooves need not be flush with the structural element as shown.

Figure 11B:
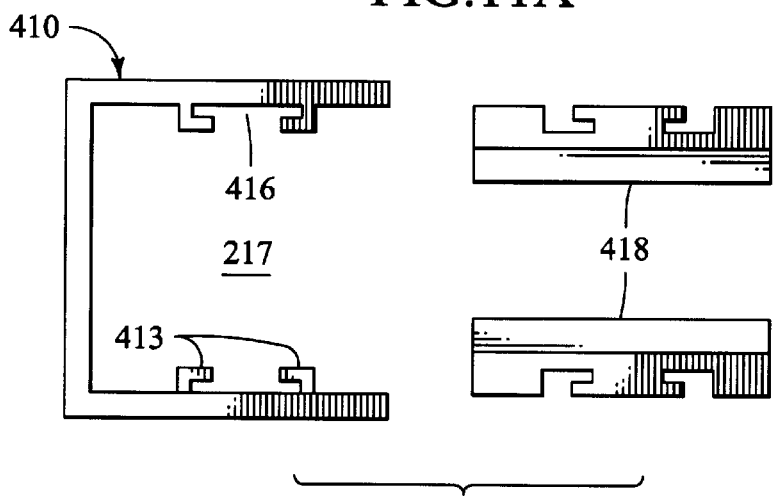
FIG. 11B is a top view of an alternatively configured structural element in accordance with the third embodiment of the present invention.

Moving to FIG. 11B, a top view is shown of another alternatively configured structural element 410 in accordance with the second embodiment of the present invention. Longitudinal grooves 416 are defined on the structural element 410 and within the channel 217. As seen, the grooves 416 can be defined on the structural element 410 so as to substantially protrude from the surface of the structural element. The support members 418 are configured to engage the grooves 416 so as to be mounted to the structural element 410. While the support member 418 is mounted on the structural element 410, the support member can supportably contact at least one electronic device 120 as shown in FIG. 6. Although the grooves 316 described for FIG. 11A above, and the grooves 216 described for FIGS. 6 through 10 above, are depicted as being integrally formed in the structural elements 210 and 310 respectively, it is understood that the grooves 416 shown in FIG. 11B can be formed by the attachment of elongated angles 413, or the like, to the structural element 410 as shown. The angles 413 can be attached to the structural element 410 by any of a number of methods including welding or fastening, or the like.

Figure 11C:
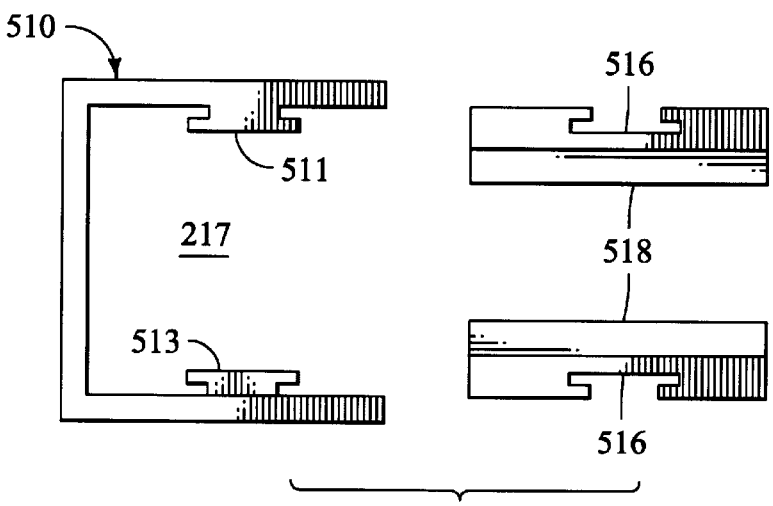
FIG. 11C is a top view of another alternatively configured structural element in accordance with the third embodiment of the present invention.

Moving now to FIG. 11C, a top view is shown of yet another alternatively configured structural element 510 in accordance with the second embodiment of the present invention. Longitudinal grooves 516 are defined on the support members 518. As is seen, the structural element 510 is configured to engage the grooves 516 so that the support members 518 will be mounted on the structural element. While the support member 518 is mounted on the structural element 510, the support member can supportably contact at least one electronic device shown in FIG. 6. As further shown in FIG. 11C, an elongated first rail 511 can be integrally formed on the structural element 510 and within the channel 217. Alternatively, an elongated second rail 513 can be attached to the structural element 510 within the channel 217 using any of a number of methods including welding or fastening, or the like. The first and second rails 511, 513 are shaped so as to engage the grooves 516 which are defined on the support members 518. As is evident, the relatively simple construction of the support apparatus described for FIGS. 3 through 11C above can be beneficial in providing a support apparatus with a relatively small parts-count. This relatively small parts-count can facilitate minimal spare parts inventory and can simplify assembly and repair procedures.

Figure 12:
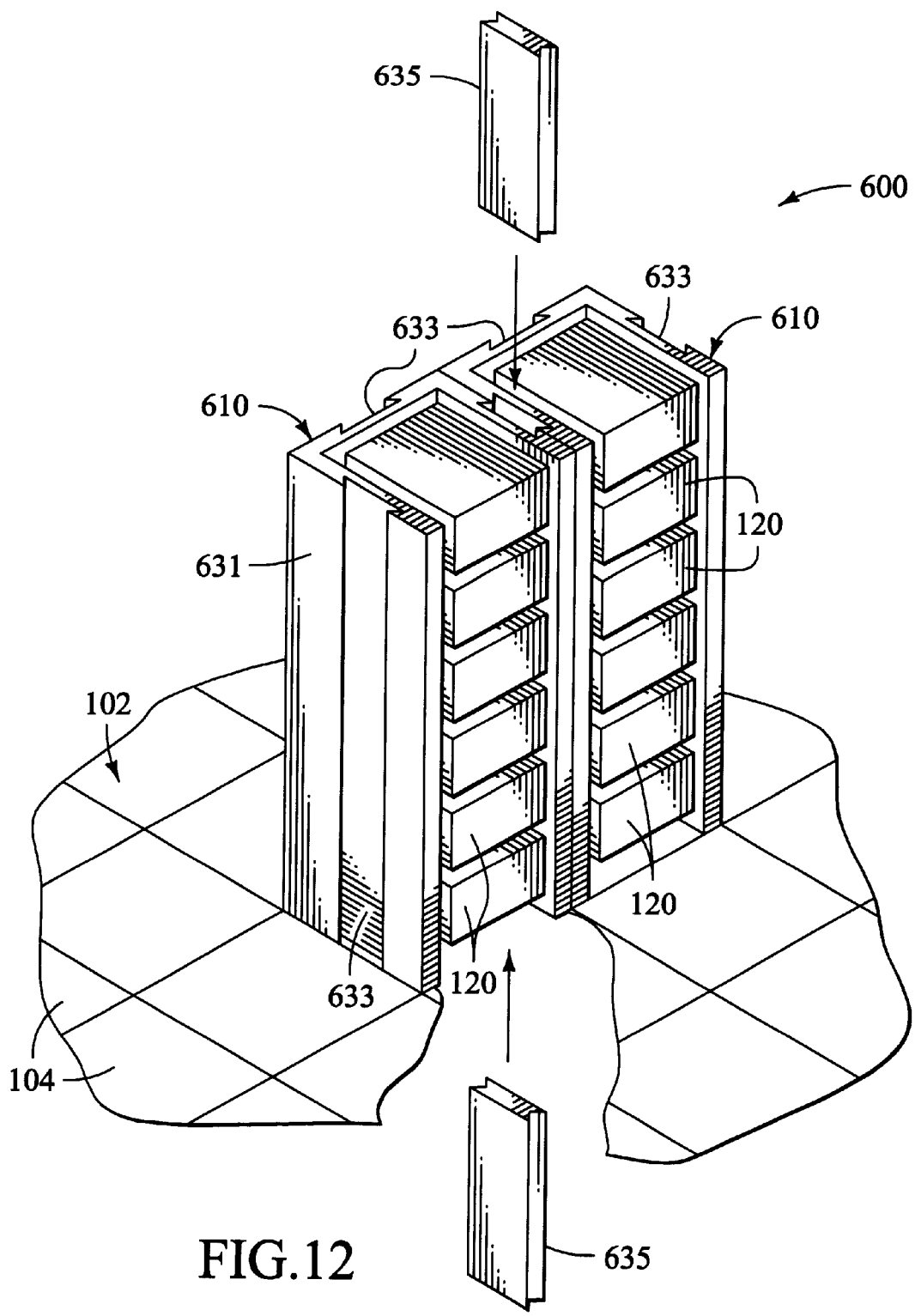
FIG. 12 is a perspective view of an apparatus in accordance with a fourth embodiment of the present invention.
Figure 13:
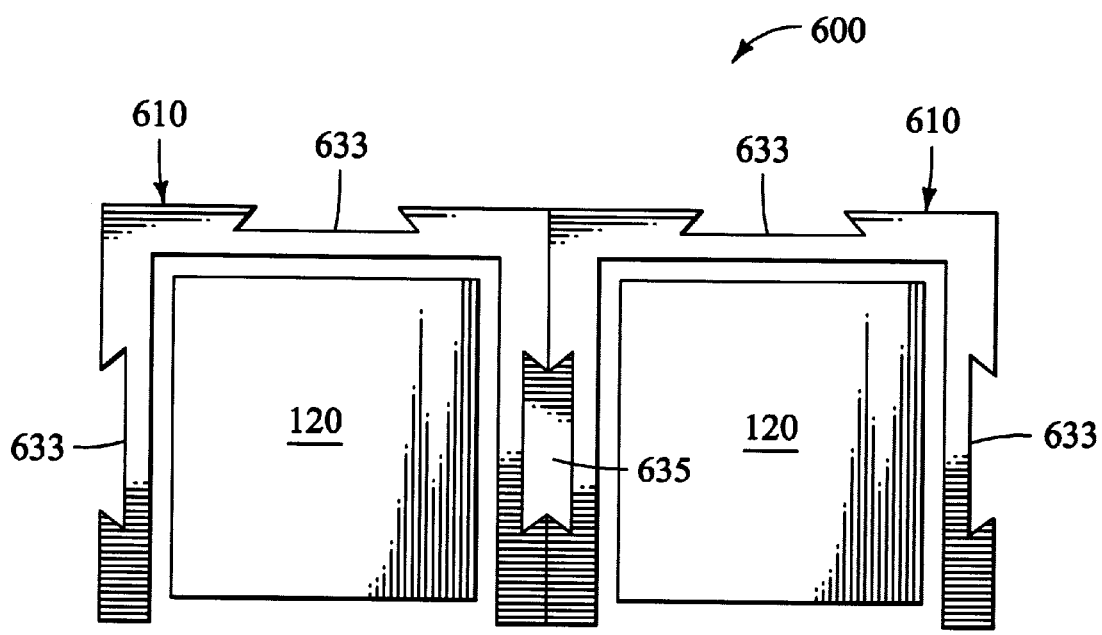
FIG. 13 is a top view of the apparatus depicted in FIG. 12.

Now turning to FIGS. 12 and 13, a perspective view is shown in FIG. 12 of an apparatus 600 in accordance with a third embodiment of the present invention. FIG. 13 shows a top view of the apparatus 600 which is depicted in FIG. 12. The apparatus 600 includes at least two structural elements 610 which can be coupled, or connected, to one another. That is, the structural elements 610 can be configured so as to be modular. Preferably, the structural elements 610 can be connected to one another in a parallel orientation. The structural elements 610 can further be connected to one another in a side-by-side orientation as shown. As is seen, the apparatus 600 is configured to support a plurality of electronic devices 120. Each structural element 610 supports at least a portion of the electronic devices 120. The electronic devices 120 can be supported on the structural elements 610 in any of a number of possible manners, including those described for FIGS. 3 through 11C above. Each of the structural elements 610 can rest on a floor 102 comprising individual floor tiles 104. As is seen, each of the structural elements 610 can have a cross-sectional profile that substantially dimensionally matches that of a floor tile 104.

As is seen, each of the structural elements 610 has an outer surface 631 on which at least one outer groove 633 is defined. The outer grooves 633 can be substantially longitudinally oriented with respect to the structural elements 610 as shown. The outer grooves 633 can also be undercut and can have any of a number of cross-sectional profiles including a dovetail profile as shown. It is understood that the outer grooves 633 can also have any of a number of other possible configurations including the configurations of the grooves described above for FIGS. 11A through 11C.

The structural elements 610 can be connected to one another using at least one interlock member 635 which simultaneously connectively engages an outer groove 633 on each of two adjacent structural elements 610. However, two or more interlock devices 635 can be configured to simultaneously engage the outer grooves 633 of two adjacent structural elements 610 as shown. The interlock member 635 can be configured to have a press-fit, or interference-fit, with each outer groove 633. The interlock member 635 can be produced using any of a number of possible methods such as extruding, molding, machining, and cutting. Moreover, the interlock member 635 can be produced from any of a number of different materials such as materials comprising steel, aluminum, plastic, vinyl, and the like.

In accordance with one variation of the third embodiment of the invention, a first structural element 610 can be provided with a female groove such as groove 633 depicted in FIGS. 12 and 13, and a second structural element (not shown) can be provided with a complementary male rail or tongue (not shown) configured to engage the female groove 633 of the first structural element 610. The two structural elements can thus be slidably engaged in side-by-side and back-to-back connections. On the one hand, this can eliminate the need for an interlock member 635, but on the other hand, it can reduce the interchangeability of the structural elements. Further, although the groove 633 is depicted herein as oriented substantially longitudinally with respect to the structural element 610, it is understood that the groove 633 can, in the alternative, be oriented substantially transversely with respect to the structural element.

Figure 15:
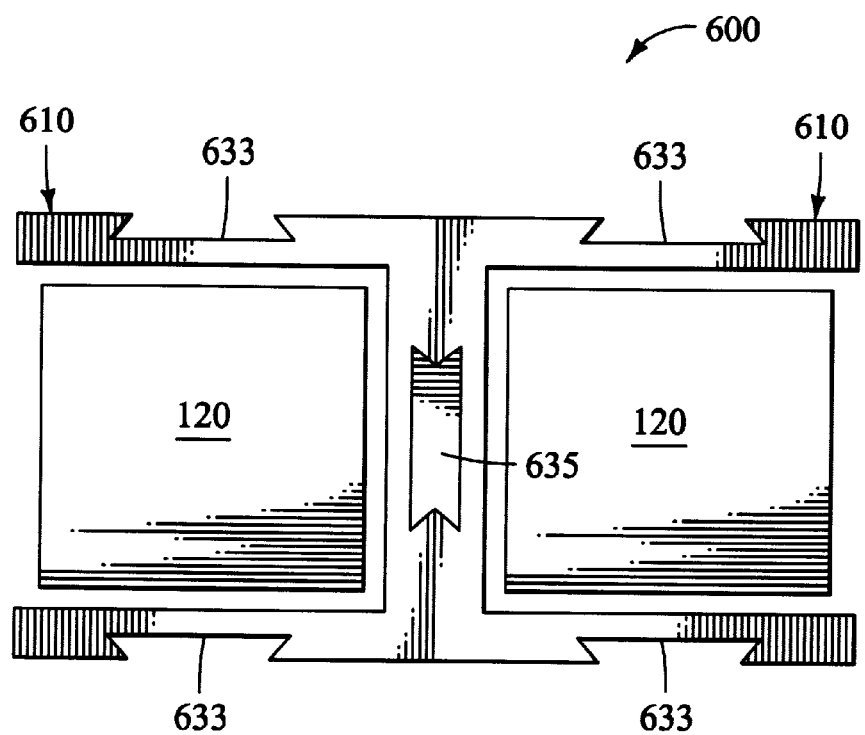
FIG. 15 is a top view of the apparatus depicted in FIG. 14.
Figure 14:
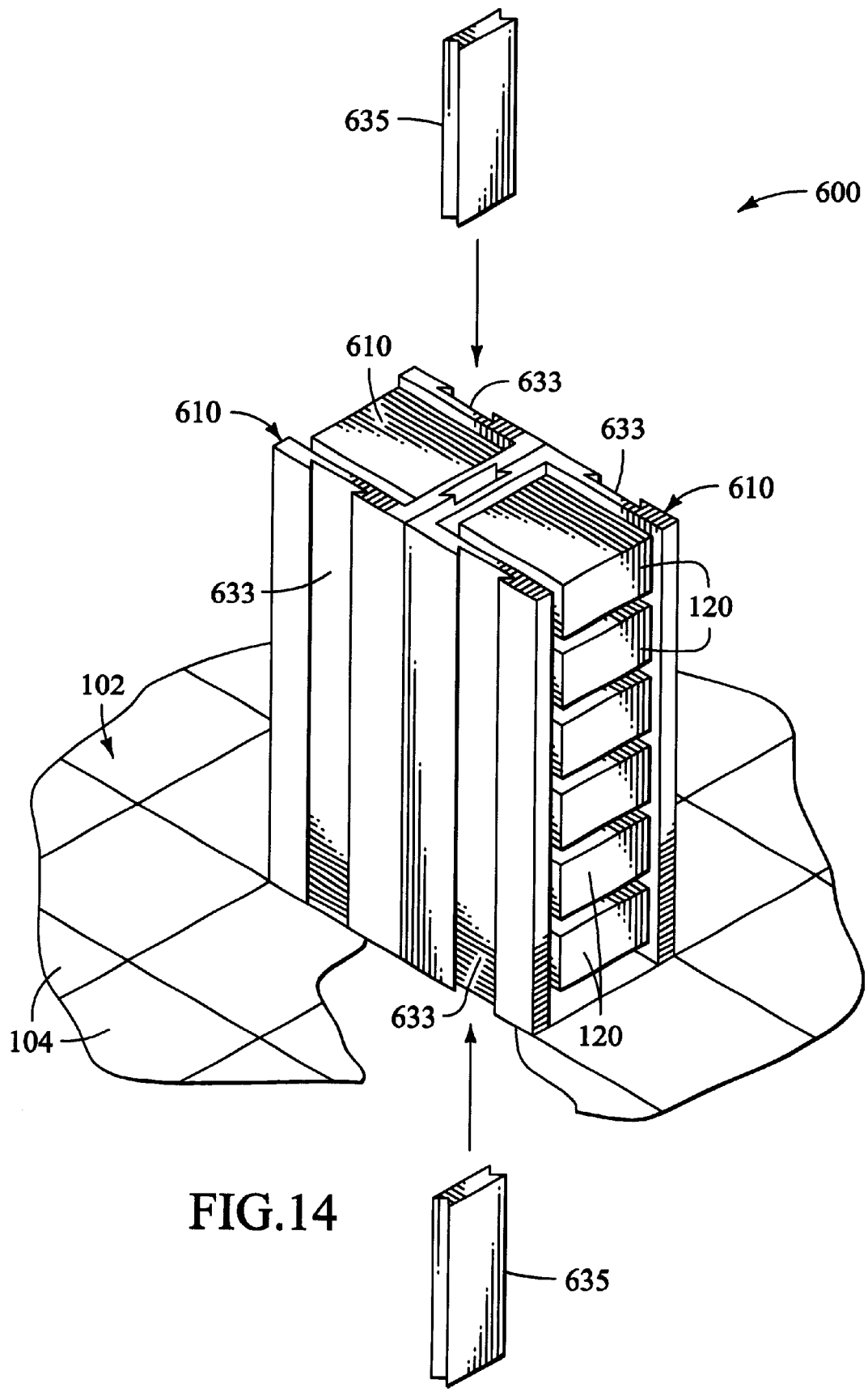
FIG. 14 is a perspective view of an apparatus in accordance with the fourth embodiment of the present invention showing an alternative orientation of the structural elements.

In addition to being placed in a side-by-side orientation, the structural elements 610 of the apparatus 600 can also be placed in a back-to-back orientation which is shown in FIGS. 14 and 15. FIG. 14 is a perspective view of the apparatus 600 with the structural elements 610 in a back-to-back orientation. FIG. 15 is a top view of the apparatus 600 which is depicted in FIG. 14. As is seen, the structural elements 610 can be placed in a back-to-back orientation and connected to one another using at least one interlock member 635 which simultaneously engages an outer groove 633 on each of the adjacent elements in a manner similar to that described for FIGS. 12 and 13 above.

Figure 16:
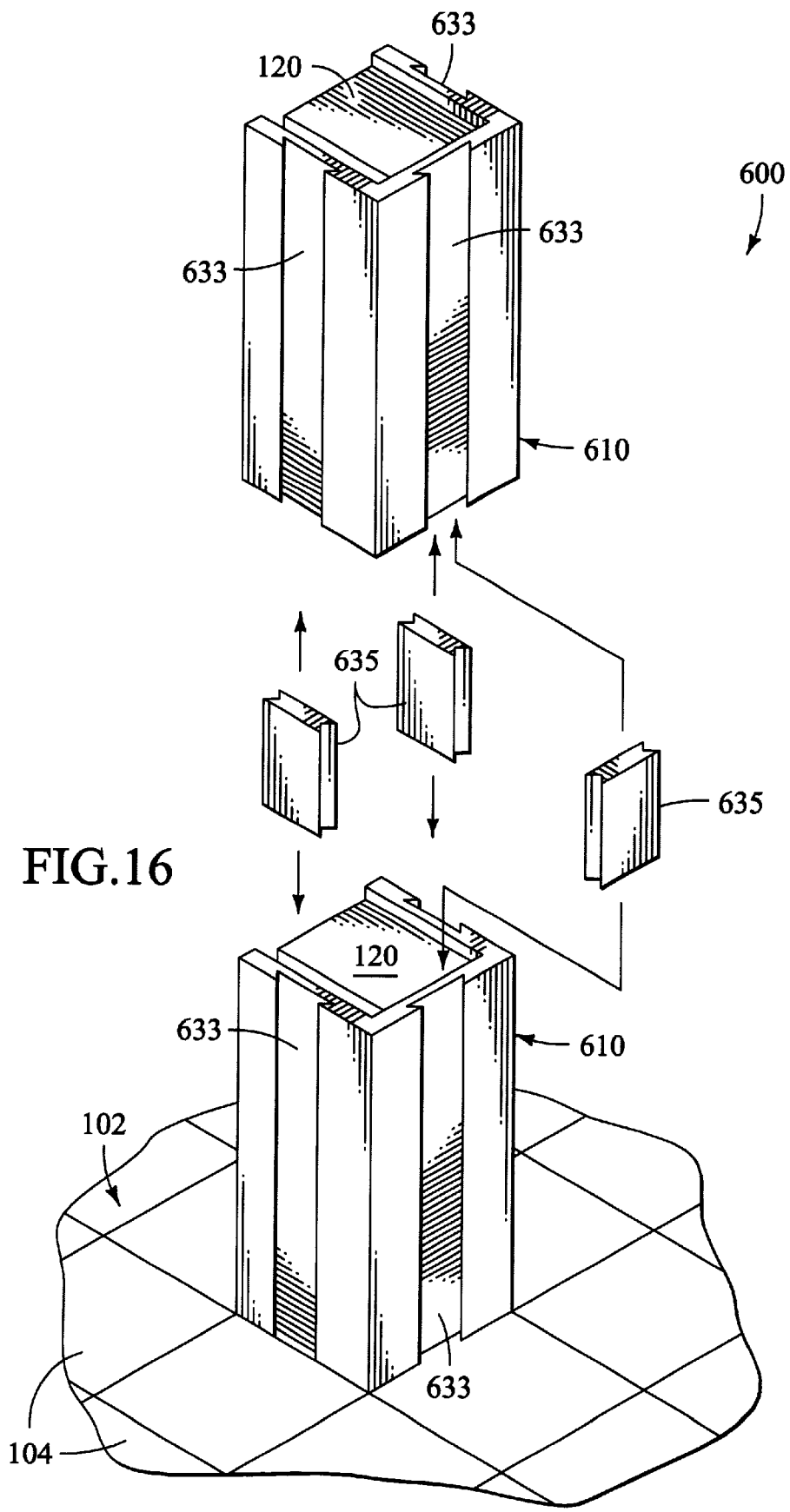
FIG. 16 is a perspective view of an apparatus in accordance with the fourth embodiment of the present invention showing another alternative orientation of the structural elements.
Figure 17:
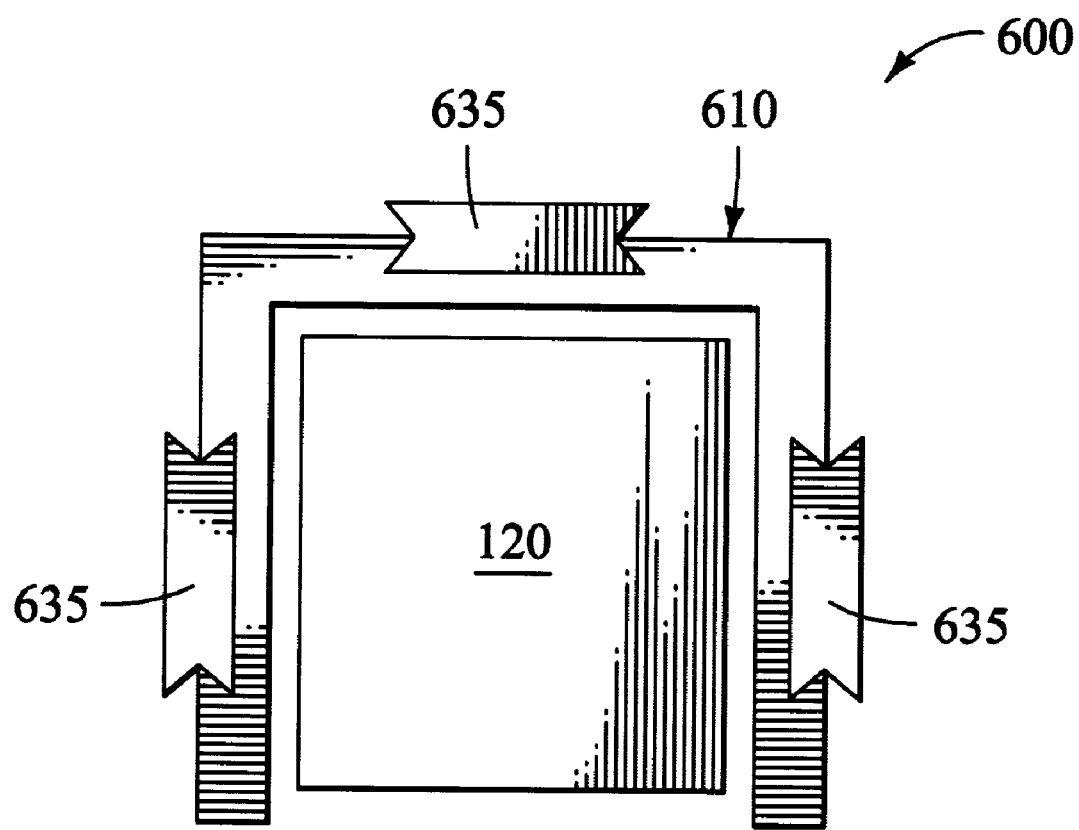
FIG. 17 is a top view of the apparatus depicted in FIG. 16.

Moreover, in addition to being placed in a back-to-back orientation and a side-by-side orientation, the structural elements 610 can also be stacked in an end-to-end orientation which is shown in FIGS. 16 and 17. FIG. 16 is a rear, perspective view of the apparatus 600 showing how the structural elements 610 are connected in a stacked, end-to-end orientation. FIG. 17 is a top view of the apparatus 600 which is depicted in FIG. 16. The structural elements 610 can be connected to one another in an end-to-end orientation using at least one interlock member 635 which simultaneously engages an outer groove 633 on each of the stacked elements in a manner similar to that described for FIGS. 12 and 13 above.

Any number of additional structural elements 610 can be connected together in the manners described above for FIGS. 12 through 17, both individually and in combination. For example, each structural element 610 can be added individually to another structural element to provide support for additional electronic devices 120. Further, structural elements 610 can be combined in two or more manners in a single apparatus 600. For example, two structural elements 610 can be stacked as shown in FIGS. 16 and 17, with two more stacked structural elements connected to the back thereof in the manner depicted in FIGS. 14 and 15.

As is evident, the modular configuration of the structural elements 610 can be beneficial in providing for incremental expansion of the support apparatus 600 in order to facilitate the support of additional electronic devices 120 as the devices are required. Additionally, the modular configuration of the structural elements 610 can be beneficial in providing flexibility in the size and shape of the apparatus 600 in order to facilitate the use of available space. It is understood that the structural elements 610 can be connected to one another using any of a number of available methods in addition to the methods shown and described herein for FIGS. 12 through 17 above. For example, the structural elements 610 can be connected to one another using threaded fasteners, or the like (not shown). Also, the interlock device 635 can be configured so as to be integral with at least one of the structural elements 610.

Further, it is understood that any structural elements 610 which are mechanically connected, such as in the manner described above for FIGS. 12 through 17, can also be electrically interconnected to one another by any of a number of manners known in the art. That is, any of the electrical devices 120, supported by one structural element 610, can be electrically connected to any of the electrical devices supported by another structural element. The electrical connection of two or more devices 120 which are supported on different structural elements 610 can be accomplished by routing electrical conductors (not shown) through a series of matching apertures (not shown) which can be defined by the structural elements.

Figure 18:
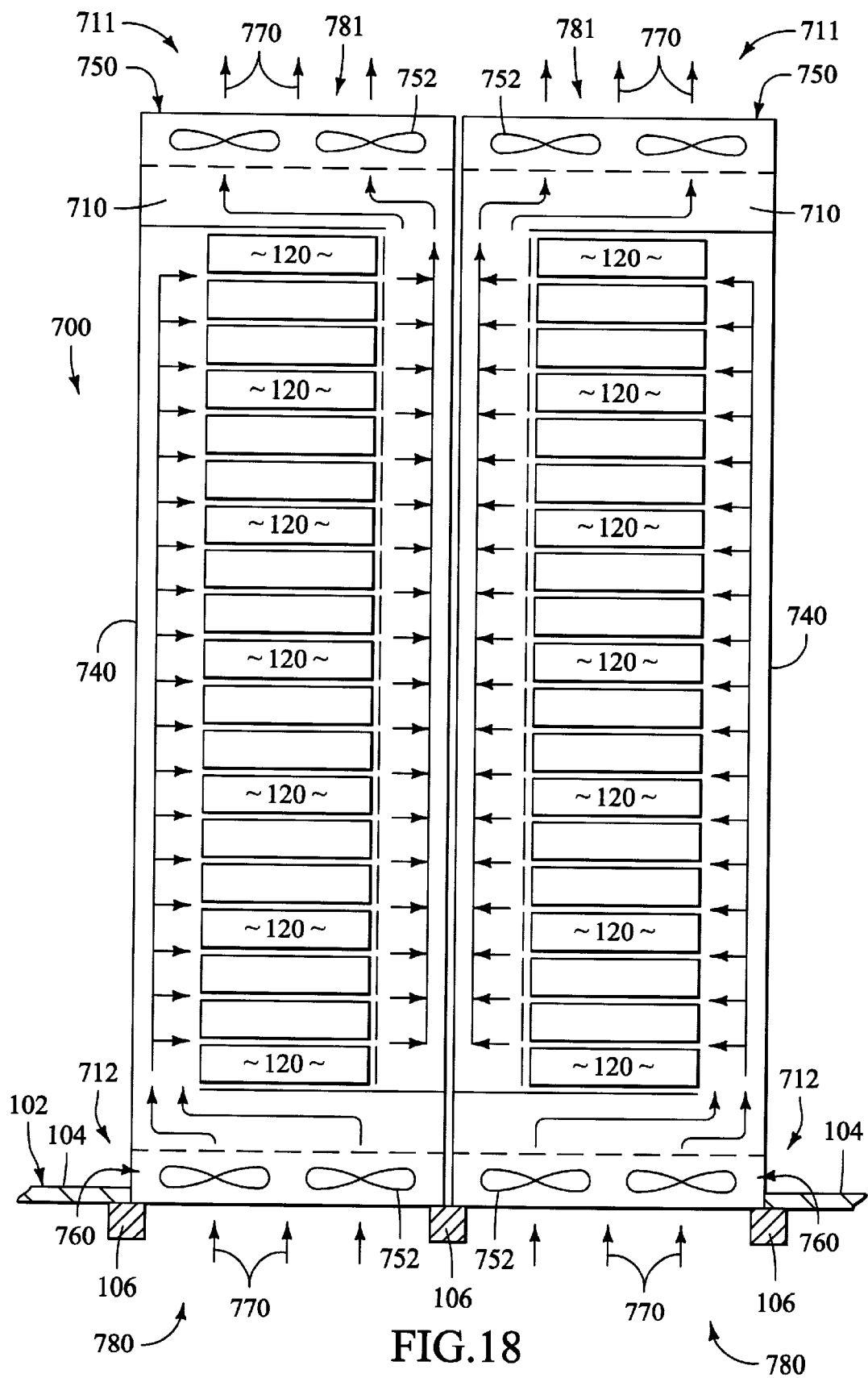
FIG. 18 is a schematic side elevation view of an apparatus in accordance with a fifth embodiment of the present invention.

Moving to FIG. 18, a schematic side elevation view is shown of a support apparatus 700 in accordance with a fourth embodiment of the present invention. The support apparatus 700 comprises at least one structural element 710 which can be configured in a manner described for FIGS. 3 through 17 above. Two structural elements 710 are shown connected to one another in a parallel, back-to-back orientation. Each structural element 710 has a first end 711 and an opposite and distal second end 712. At least one substantially solid door or panel 740 can be employed to seal each of the structural elements 710 so as to create a tunnel-like enclosure in which a plurality of electronic devices 120 are housed while being supported on each of the structural elements 710. Each of the structural elements 710 can be supported in a substantially upright orientation on a floor 102 or the like. The floor 102 can comprise a plurality of individual floor tiles 104 which are supported on floor beams 106 or the like. As discussed above for FIGS. 3 through 17, the cross-sectional profile of each of the structural elements 710 can substantially dimensionally match the size of a floortile 104. As is seen, floor tiles 104 have been removed from under each of the structural elements 710, but have been left in place surrounding the structural elements. The removal of the floor tiles 104 creates an opening beneath each of the structural elements 710 which rest on the floor beams 106.

As is further seen, the support apparatus 700 can comprise a cap assembly 750 which is attached to the first end of each of the structural elements 710. The cap assembly 750 can be attached to the respective structural element 710 using any number of attachment methods (not shown), including a method similar to that employed for connecting structural elements 610 together in an end-to-end fashion as described above for FIGS. 16 and 17. Still referring to FIG. 18, the cap assembly 750 can include at least one fan or blower 752, or the like. The support apparatus 700 can also comprise a base assembly 760 which is attached to the second end of each of the structural elements 710. The base assembly 760 can also include at least one fan 752. By including fans 752 in both the cap assembly 750 and the base assembly 760, a redundant air handling system is provided. The fans 752 can create a stream of cooling air, indicated by arrows 770, which moves through each structural element 710 from the second end 712 to the first end 711. The cooling air stream 770 moves through or between the electronic devices 120. The cooling air stream 770 can enter the respective structural element 710 from beneath the floor 102. The second end 712 of each structural element 710 acts as a cooling air inlet 780 where the stream of air 770 can enter through the opening created by the removal of the floor tiles 104 from beneath each of the structural elements. The stream of cooling air 770 exits the respective structural element 710 at the first end 711 which can act as a cooling air outlet 781. After exiting the structural element 710, the stream of air 770 can be directed through a ceiling (not shown).

Figure 19:
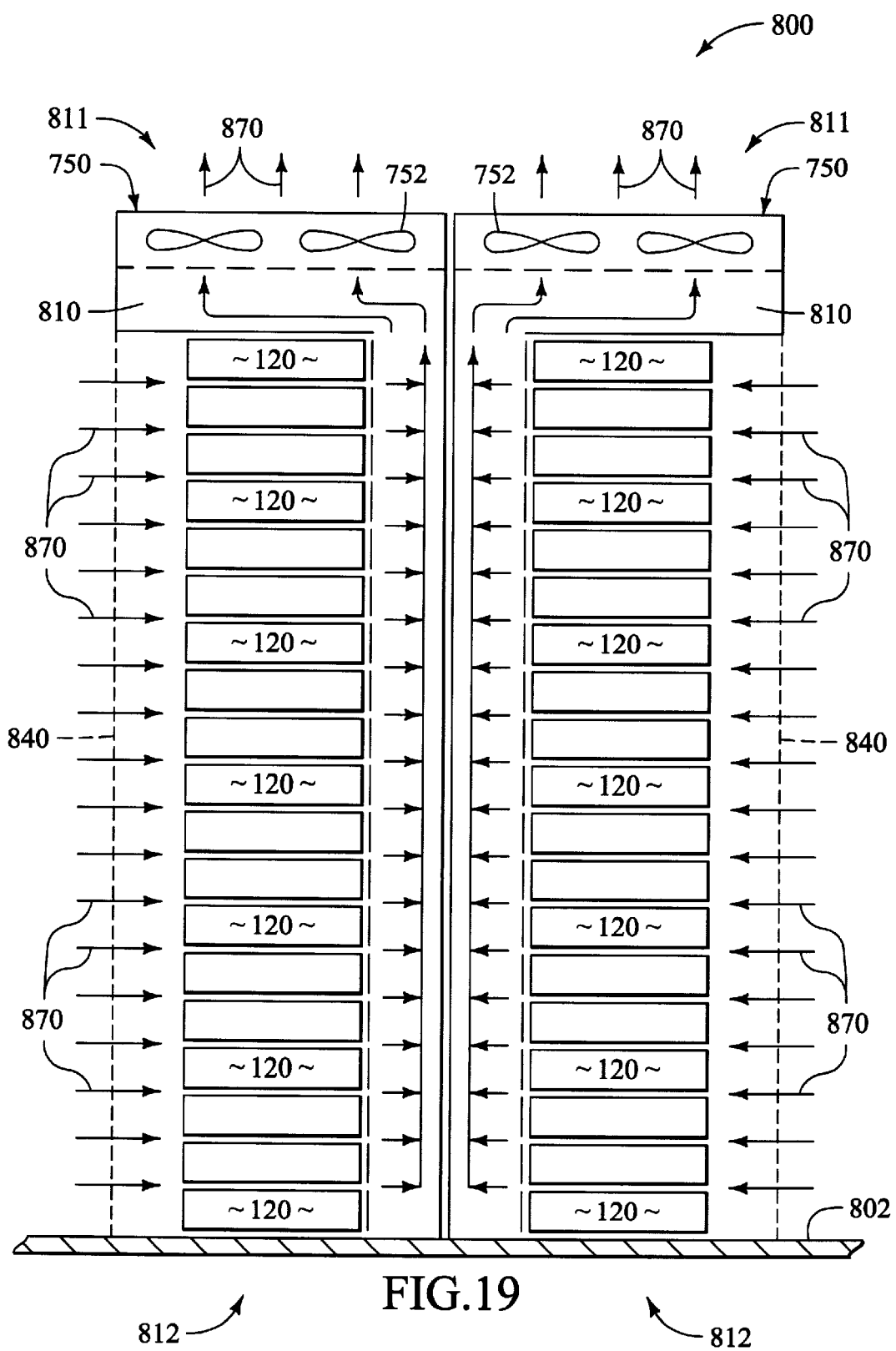
FIG. 19 is a schematic side elevation view of an apparatus in accordance with a sixth embodiment of the present invention.

An alternative embodiment of a support apparatus is depicted in FIG. 19. FIG. 19 is a schematic side elevation view of the apparatus 800 in accordance with a fifth embodiment of the present invention. The apparatus 800 comprises at least one structural element 810 which is supported on a floor 802 or the like in a substantially upright orientation as shown. Two such structural elements 810 are shown connected to one another in a substantially parallel, back-to-back orientation. Each structural element 810 has a first end 811 and an opposite distal end 812. Each structural element 810 can support a plurality of electronic devices 120 in any of the manners described above for FIGS. 3 through 17. At least one perforated, or substantially open, door or panel 840 can be attached to each of the structural elements 810. Alternatively, the door or panel 840 can be omitted.

The apparatus 800 further comprises a cap assembly 750. A cap assembly 750 is shown attached to the first end 811 of each of the structural elements 810. Each cap assembly 750 can include a fan or blower 752. The fans 752 create a stream of cooling air 870 which enters the apparatus 800 through the door or panel 840 and circulates through or between the electronic devices 120. The stream of cooling air 870 exits the first end 811 of each structural element 810 through the respective cap assembly 750.

One advantage of the configurations depicted in FIGS. 18 and 19 is that the cooling air streams 770, 870 can flow in a generally upward direction, which is the same direction as the general natural convection flow for air. This can reduce the power requirements for moving the streams of cooling air 770, 870, since movement is naturally aided by convection. Also, as compared to prior art horizontal exhaust, the top-mounted exhaust of the present invention substantially prevents the intake by one unit of hot exhaust air from another unit. It is understood that an extendible cable management feature (not shown) can be incorporated into the cap assembly 750. The extendible cable management feature (not shown) can facilitate electrical connections between electrical devices 120 which are supported on different structural elements 710, 810. It is further understood that, although the invention is generally depicted herein as having a vertical orientation, other orientations are possible which are not shown. For example, the invention could be utilized in a substantially horizontal orientation (not shown).

A further embodiment of the present invention includes a method of supporting a plurality of electronic devices. The method includes forming at least one structural element on which the electrical devices can be supported. The structural element can be formed using any of a number of methods, including extruding, molding, bending, rolling, forging, casting, and welding. The structural element can be made from any of a number of materials comprising aluminum, plastic, vinyl, resin, steel, carbon fiber, or the like. The structural element can be configured to define a multi-sided channel in which the electronic devices can be supported. The structural element can be a single-piece configuration or a multi-piece configuration. The structural element can also be formed by cutting to length, or otherwise adapting for use, ready-made structural materials, or the like.

The method also includes providing the structural element in an environment in which the apparatus is to be used. The method includes forming, or otherwise defining, support surfaces on the structural element. The support surfaces can be configured to contact the electronic devices so as to support the devices on the structural element. The support surfaces can be integral to the structural element or can be attached to the structural element. For example, the support surfaces can be formed, or otherwise defined, on a support member which can be attached to, or mounted on, the structural element. The method includes attaching, or mounting, the support member to the structural element using any of a number of methods. For example, the support member can be attached to the structural element using conventional fasteners, or the like. Alternatively, a longitudinal groove can be formed on the structural element, with which the support member can be engaged so as to be mounted on the structural element. The longitudinal groove can be formed integrally with the structural element, or can be formed by attaching rails or the like to the structural element. The groove can be substantially open-ended, and can also be undercut. The support structure can be configured to have a press-fit, or interference fit, with the longitudinal groove. The method further includes configuring the structural element to have a cross-sectional profile which substantially dimensionally matches the size of a floor tile of a floor on which the structural element is to rest.

The method includes providing at least two structural elements which can be connected to one another so that each structural element can support a plurality of electronic devices. The method preferably includes connecting the structural elements to one another in a substantially parallel orientation. The parallel orientation can include a side-by-side orientation, as well as a back-to-back orientation and an end-to-end orientation. The structural elements can be connected to one another using any of a number of methods. For example, the structural elements can be connected using conventional fasteners or the like.

Alternatively, the structural elements can be connected to one another by forming at least one outer groove on each of the structural elements. Each of the outer grooves can be substantially longitudinal with respect to the structural element, and can also be open-ended. The outer grooves can also be undercut and can have any of a number of possible cross-sectional profiles. The method can include providing an interlock member and employing the interlock member to connect the structural elements to one another.

The interlock member can be engaged simultaneously with at least one outer groove on each of two or more adjacent structural elements which are to be connected together. The interlock member can be configured so as to have a press-fit, or interference-fit, with the outer grooves. Further, the interlock member can be formed using any of a number of forming methods as discussed above for the structural element. The interlock member can also be formed from any of a number of materials as also discussed above for the structural element.

As is evident, the method includes connecting a structural element to another structural element as additional electronic devices are required. Also, the method includes connecting two or more structural elements together in order to fit in an available space. The method also includes removing a floor tile before placing a structural element so as to create an opening in the floor below the structural element. Cooling of the electronic devices can be provided by attaching a cap assembly on one end of the respective structural element. An air-handing unit can be created by providing at least one fan or blower as part of the cap assembly. Cooling of the individual electronic devices is accomplished by moving a stream of air through the cap assembly. Providing a perforated door or panel can allow the stream of air to enter the support apparatus. Alternatively, the stream of air can enter the support apparatus from beneath the floor through the opening in the floor. In that case, providing a solid door or panel to create a tunnel-like enclosure within the structural element can facilitate the flow of air through or between the electronic devices. Additional air-handling capacity can be provided by attaching a base assembly to the first end of the respective structural element. The base assembly can also include a fan or blower and can form an inlet for the stream of air entering the structural element. Additional control of the stream of air can be accomplished by directing the stream of air through the ceiling after it exits the structural element.

While the above invention has been described in language more or less specific as to structural and methodical features, it is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An apparatus for operatively supporting a plurality of electronic devices, the electronic devices chosen from the group consisting of disk drives, controllers, and power supplies, the apparatus comprising:

a support member that defines a support surface on which an electronic device is supportable; and, a structural element on which the plurality of electronic devices can be supported, and wherein:

the structural element is a single piece;

the structural element defines a three-sided, elongated channel having a substantially rectangular cross section, wherein the channel's length is substantially greater than both the channel's width and the channel's depth, and wherein the plurality of electronic devices is supportable within the channel;

the structural element comprises a substantially flat web portion which is oriented between a pair of integral, spaced, substantially flat, substantially parallel, juxtaposed flange portions which extend substantially normally from the web portion;

an undercut longitudinal groove is defined by the structural element and within the channel;

the groove runs the entire length of the structural element; and, the support member is connectable with the structural element by way of supportable engagement of the support member with the longitudinal groove.

2. An apparatus for operatively supporting a plurality of electronic devices, the electronic devices chosen from the group consisting of disk drives, controllers, and power supplies, the apparatus comprising:

an interlock member; and, a structural element on which the plurality of electronic devices can be supported, and wherein:

the structural element is a single piece;

the structural element defines a three-sided, elongated channel having a substantially rectangular cross section, wherein the channel's length is substantially greater than both the channel's width and the channel's depth, and wherein the plurality of electronic devices is supportable within the channel;

the structural element comprises a substantially flat web portion which is oriented between a pair of integral, spaced, substantially flat, substantially parallel, juxtaposed flange portions which extend substantially normally from the web portion;

an undercut outer groove is defined by the structural element outside of the channel;

the groove runs the entire length of the structural element;

the interlock member is engagable with the outer groove; and, two like structural elements are substantially rigidly connectable to one another by way of concurrent engagement of the interlock member with the respective outer grooves of each connected structural element.

3. An apparatus for operatively supporting electronic devices, the electronic device chosen from the group consisting of disk drives, controllers, and power supplies, the apparatus comprising:

an interlock member;

a plurality of like, single-piece, elongated structural elements each defining an elongated longitudinal channel having a substantially rectangular cross section, in which channel a plurality of electronic devices is supportable, wherein each of the structural elements defines an outer groove with which the interlock member is engagable, and wherein two structural elements are substantially rigidly connectable to one another in substantially parallel orientation by way of concurrent engagement of the interlock member with the respective outer grooves of each of the connected structural elements.

4. The apparatus of claim 3, and wherein the outer groove is undercut, open-ended, and runs the entire length of the structural element.

5. An apparatus for operatively supporting electronic devices, the electronic devices chosen from the group consisting of disk drives, controllers, and power supplies, the apparatus comprising:

at least one interlock member;

a plurality of like, single-piece, elongated structural elements each defining an elongated longitudinal channel having a substantially rectangular cross section, in which channel a plurality of electronic devices is supportable, wherein:

each structural element comprises a substantially flat web portion which is oriented between a pair of integral, spaced, substantially flat, substantially parallel, juxtaposed flange portions which extend substantially normally from the web portion;

each structural element defines three outer grooves, with each of which the interlock member is engagable;

one of the outer grooves of each structural element is defined on the web portion;

one of the outer grooves of each structural element is defined on each of the flange portions; and, the outer grooves are open-ended and run the entire length of the respective structural element.

6. The apparatus of claim 5, and wherein concurrent engagement of at least one interlock member with selected outer grooves of two structural members facilitates substantial rigid connection thereof with one another in a back-to-back, parallel orientation.

7. The apparatus of claim 5, and wherein concurrent engagement of at least one interlock member with selected outer grooves of two structural members: facilitates substantial rigid connection thereof with one another in a side-by-side, parallel orientation.

8. The apparatus of claim 5, and wherein concurrent engagement of at least one interlock member with selected outer grooves of two structural members facilitates substantial rigid connection thereof with one another in an end-to-end, parallel orientation.

9. The apparatus of claim 5, and further comprising a floor upon which the structural elements are supportable, wherein:

the floor comprises a plurality of like floor tiles, each having substantially identical given dimensions; and, each of the structural elements has a footprint that substantially dimensionally matches the given dimensions, wherein removal of one of the floor tiles from a given location on the floor prior to placement of one of the structural elements at the given location facilitates the flow of air from beneath the floor and through the structural element.

* * * * *